(12) United States Patent
Kawamura et al.

(10) Patent No.: US 10,410,826 B2
(45) Date of Patent: Sep. 10, 2019

(54) DEVICE PROCESSING METHOD AND DEVICE PROCESSING APPARATUS

(71) Applicant: HITACHI, LTD., Tokyo (JP)

(72) Inventors: Tetsufumi Kawamura, Tokyo (JP); Misuzu Sagawa, Tokyo (JP); Kazuki Watanabe, Tokyo (JP); Keiji Watanabe, Tokyo (JP); Shuntaro Machida, Tokyo (JP); Nobuyuki Sugii, Tokyo (JP); Daisuke Ryuzaki, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/069,796

(22) PCT Filed: Mar. 18, 2016

(86) PCT No.: PCT/JP2016/058687
§ 371 (c)(1),
(2) Date: Jul. 12, 2018

(87) PCT Pub. No.: WO2017/158820
PCT Pub. Date: Sep. 21, 2017

(65) Prior Publication Data
US 2019/0013179 A1    Jan. 10, 2019

(51) Int. Cl.
*H01J 37/28* (2006.01)
*H01J 37/302* (2006.01)
*H01J 37/305* (2006.01)
*H01L 21/3065* (2006.01)
(Continued)

(52) U.S. Cl.
CPC ............... *H01J 37/28* (2013.01); *B81C 1/00* (2013.01); *H01J 37/3023* (2013.01); *H01J 37/3056* (2013.01); *H01L 21/3065* (2013.01); *H01L 22/26* (2013.01); *B81C 2201/0132* (2013.01); *H01J 2237/30411* (2013.01); *H01J 2237/31745* (2013.01); *H01J 2237/31749* (2013.01)

(58) Field of Classification Search
CPC .................................................... H01L 21/3065
See application file for complete search history.

(56) References Cited

U.S. PATENT DOCUMENTS

2004/0129351 A1   7/2004  Iwasaki
2018/0005906 A1*  1/2018  Sagawa ............... B81C 1/00547

FOREIGN PATENT DOCUMENTS

JP   2004-209626 A   7/2004
JP   2005-044570 A   2/2005

OTHER PUBLICATIONS

International Search Report dated May 31, 2016 for the PCT International Application No. PCTJP2016/058687.

* cited by examiner

*Primary Examiner* — William A Harriston
(74) *Attorney, Agent, or Firm* — Volpe and Koenig, P.C.

(57) ABSTRACT

The invention is directed to a technique for reducing the time from the start of fabrication of a prototype structure to the completion of fabrication of a real structure. A device processing method includes steps of: fabricating a first structure using an ion beam under a first condition in a first region on a substrate; measuring a size of the first structure which is fabricated; comparing the measurement result with design data; determining a second condition from the comparison result; and fabricating a second structure using the ion beam under the second condition in a second region on the substrate.

14 Claims, 9 Drawing Sheets

(51) Int. Cl.
*H01L 21/66* (2006.01)
*B81C 1/00* (2006.01)

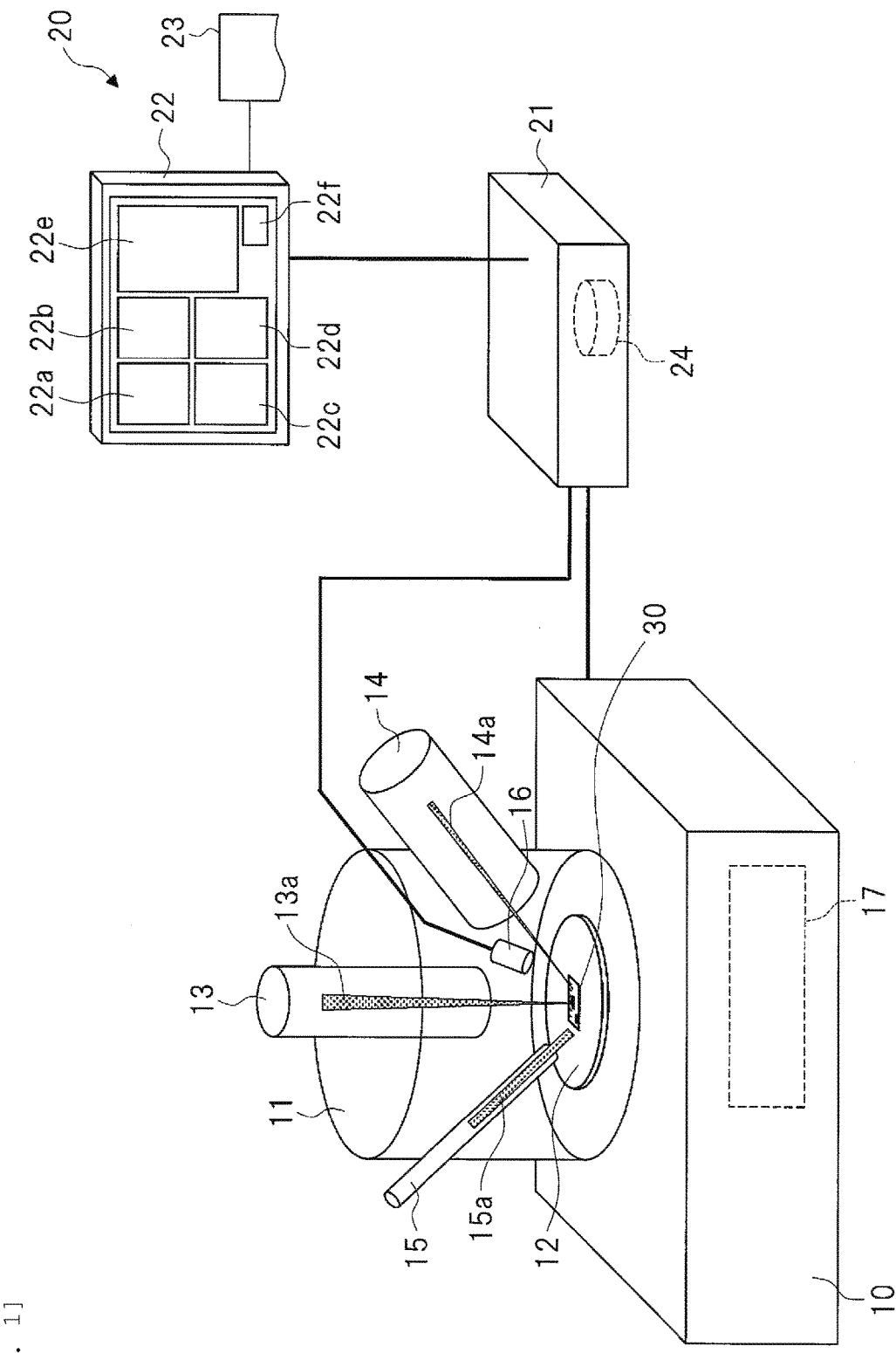
[FIG. 1]

[FIG. 2]
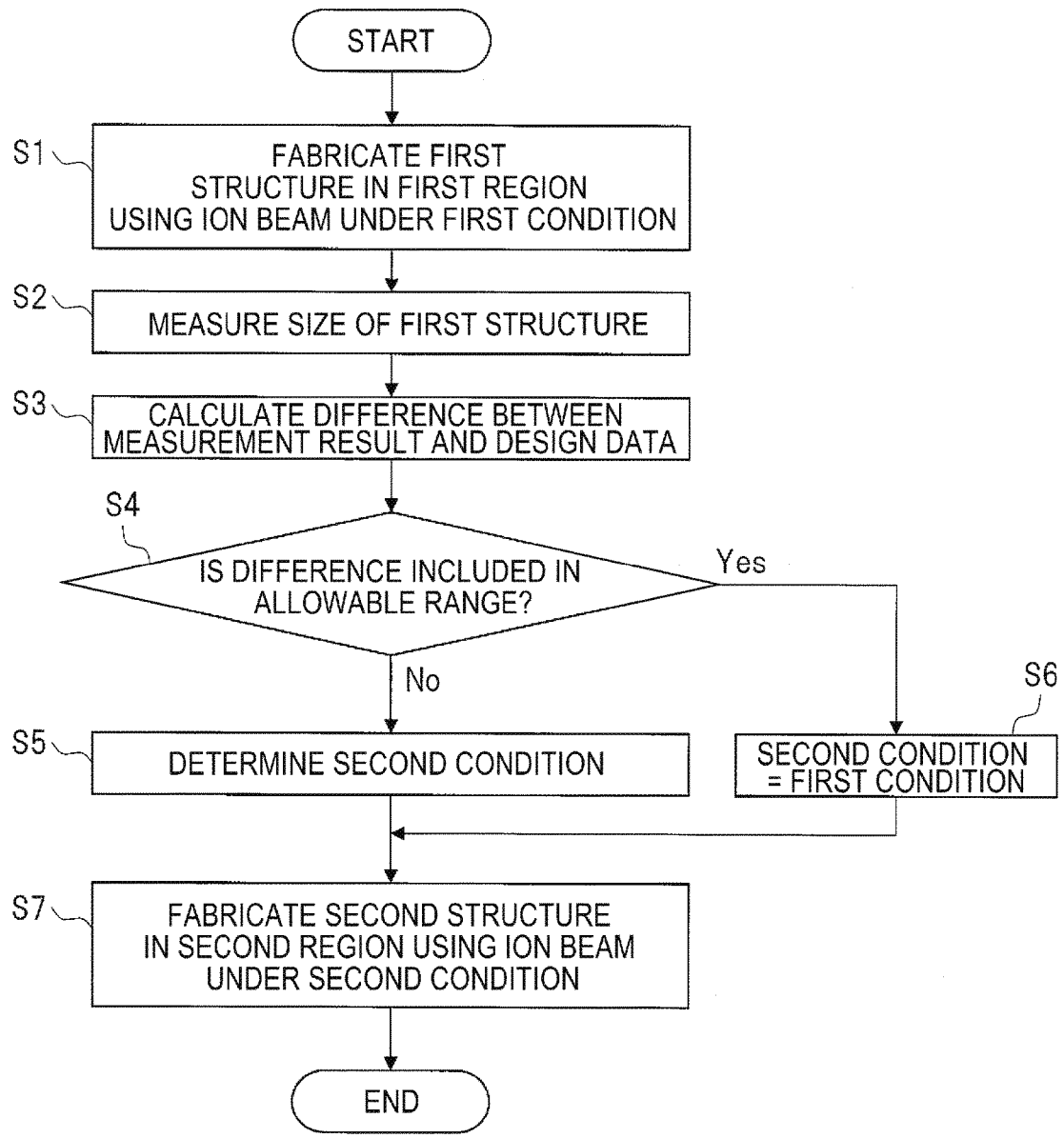

[FIG. 3]
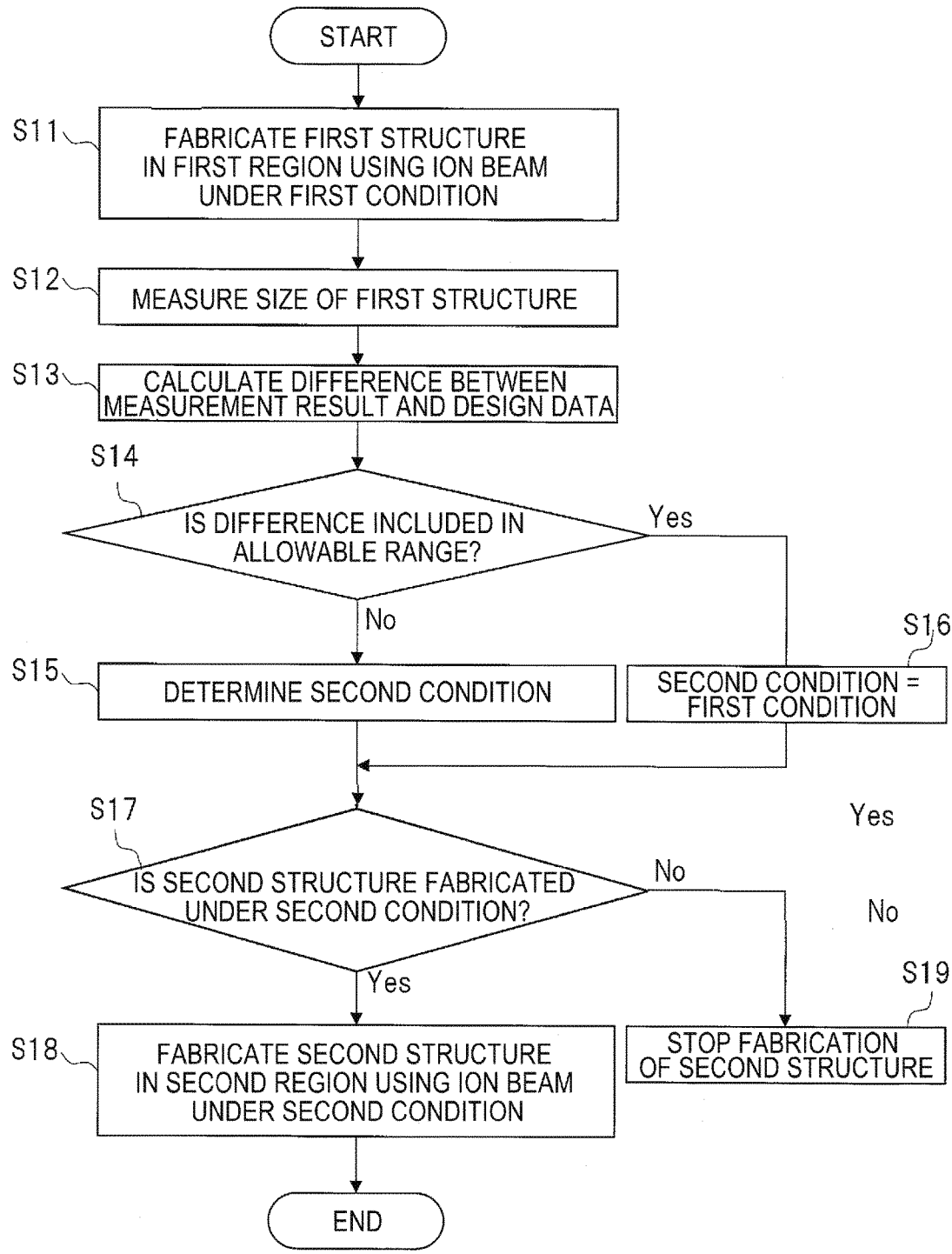

[FIG. 4]
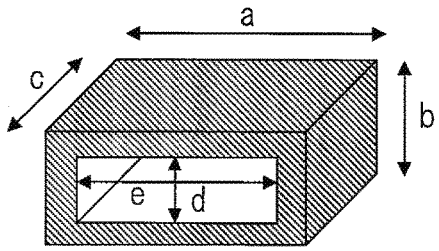
[FIG. 5]
| DESIGN DATA | | | | | | | |
|---|---|---|---|---|---|---|---|
| SIZE DATA[μm] | | | | ALLOWABLE RANGE[μm] | | | |
| a | b | c | ... | ±Δa | ±Δb | ±Δc | ... |
| 10.2 | 5.1 | 2.2 | ... | ±0.4 | ±0.2 | ±0.3 | ... |
151 — SIZE DATA; 152 — ALLOWABLE RANGE; 150
[FIG. 6]
| MEASUREMENT DATA[μm] | | | | 
|---|---|---|---|
| a | b | c | ... |
| 9.9 | 5.0 | 2.4 | ... |
153
[FIG. 7]
| DIFFERENTIAL DATA[μm] | | | |
|---|---|---|---|
| a | b | c | ... |
| 0.3 | 0.1 | 0.2 | ... |
154

[FIG. 8]
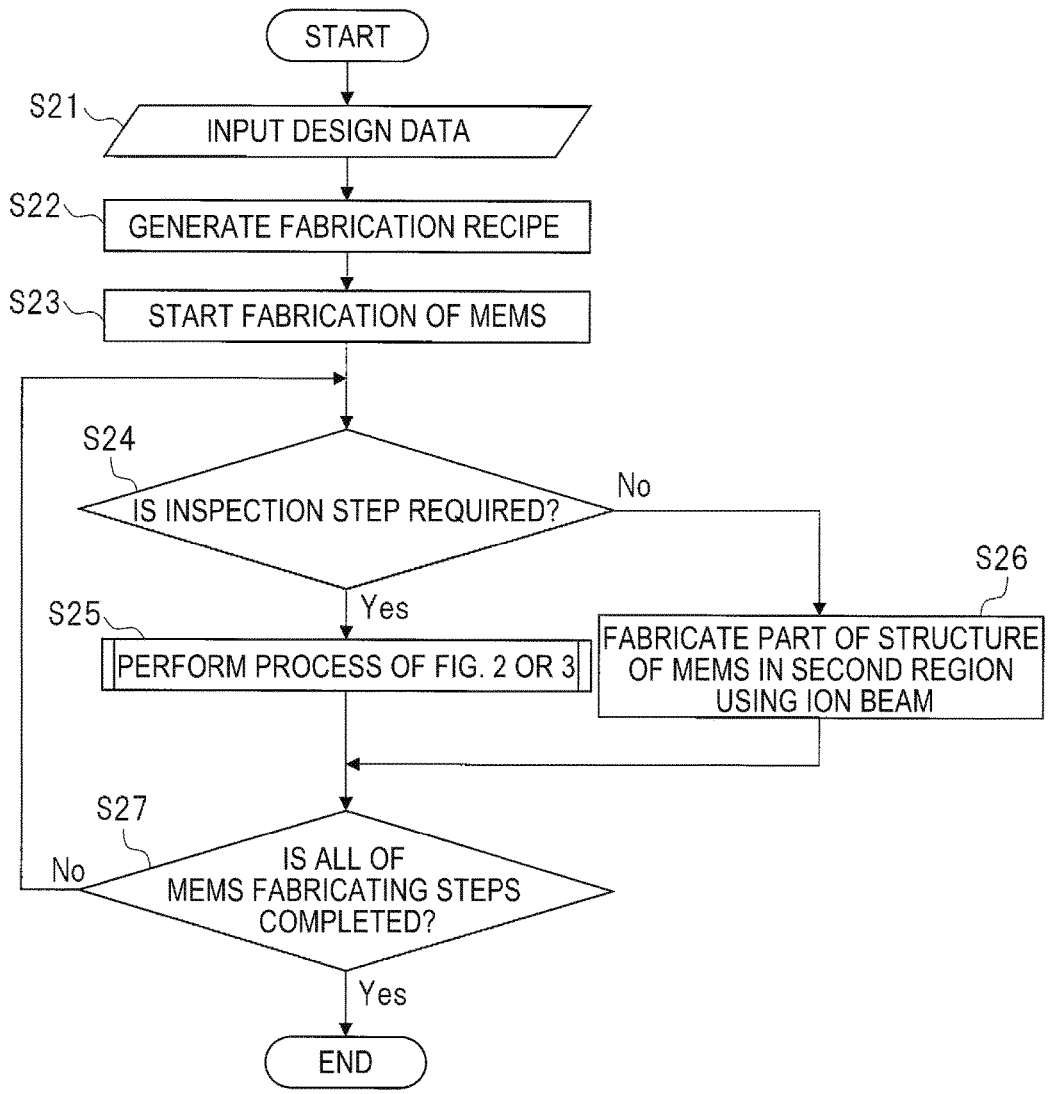

[FIG. 9]
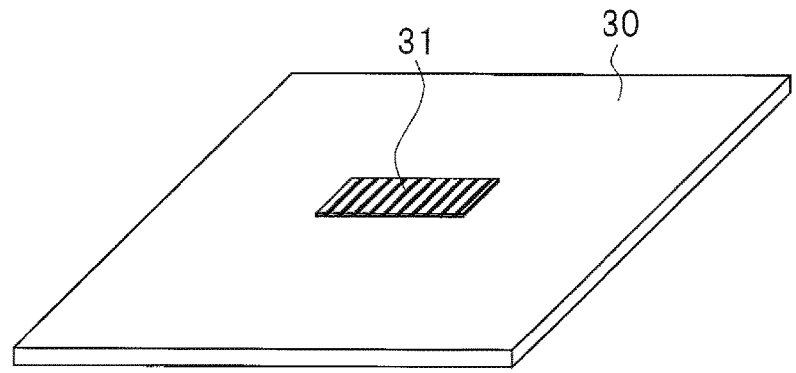
[FIG. 10]
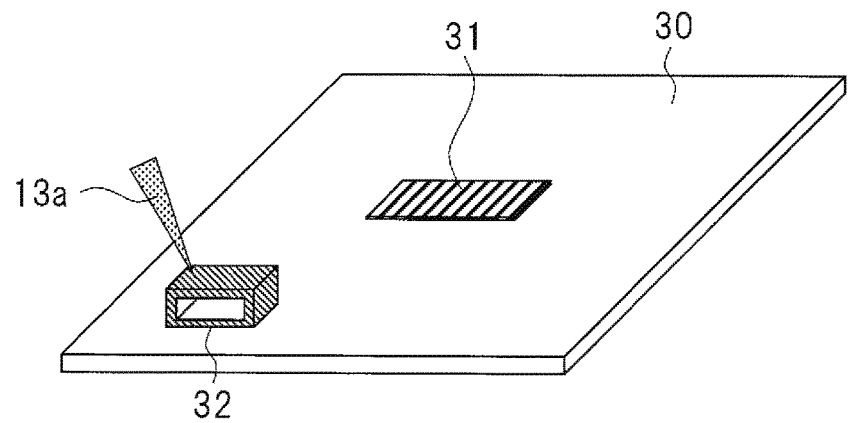
[FIG. 11]
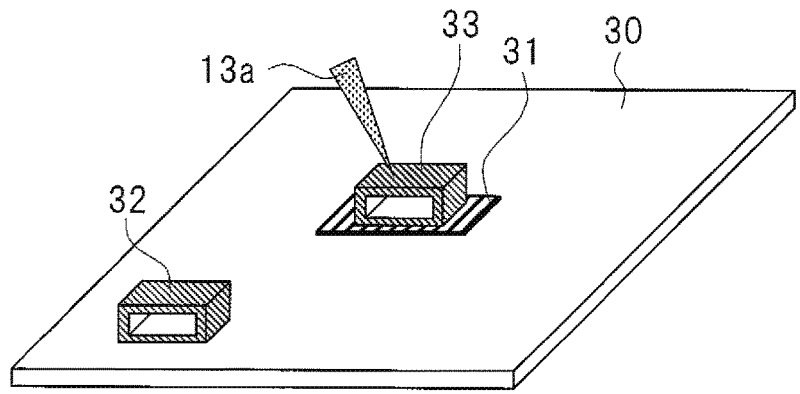

[FIG. 12]
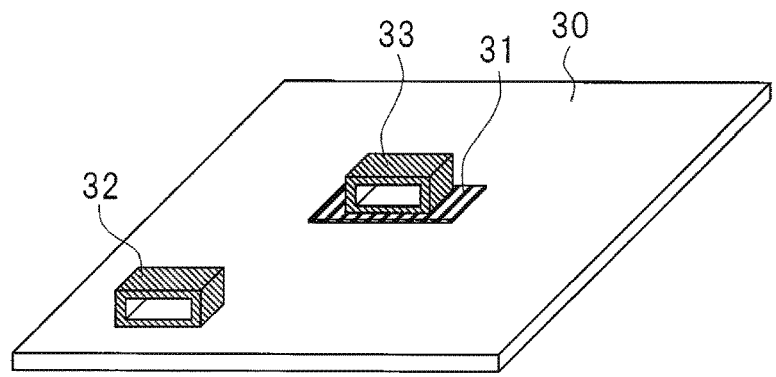
[FIG. 13]
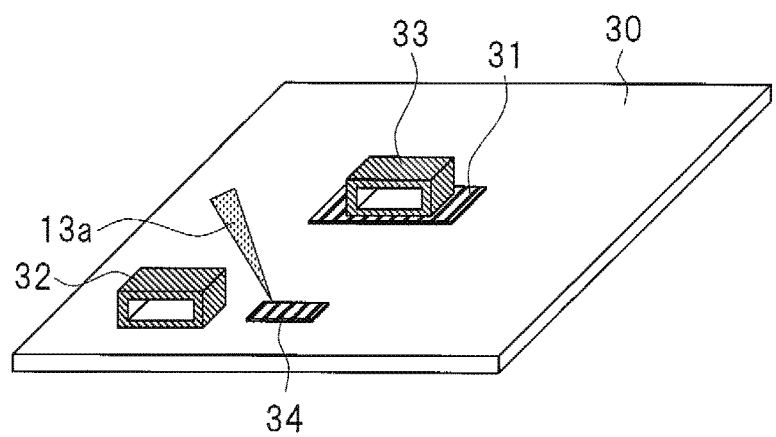
[FIG. 14]
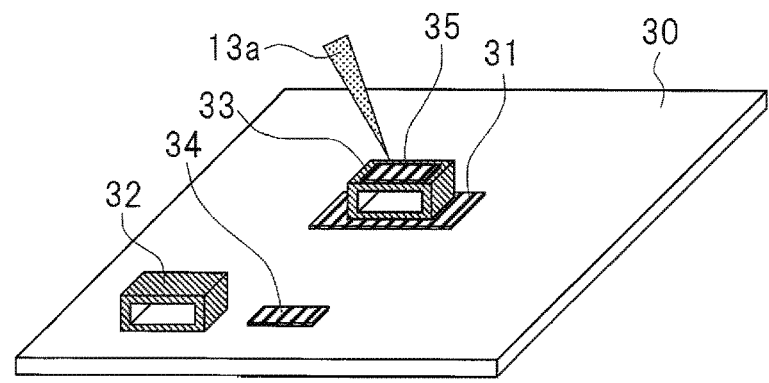

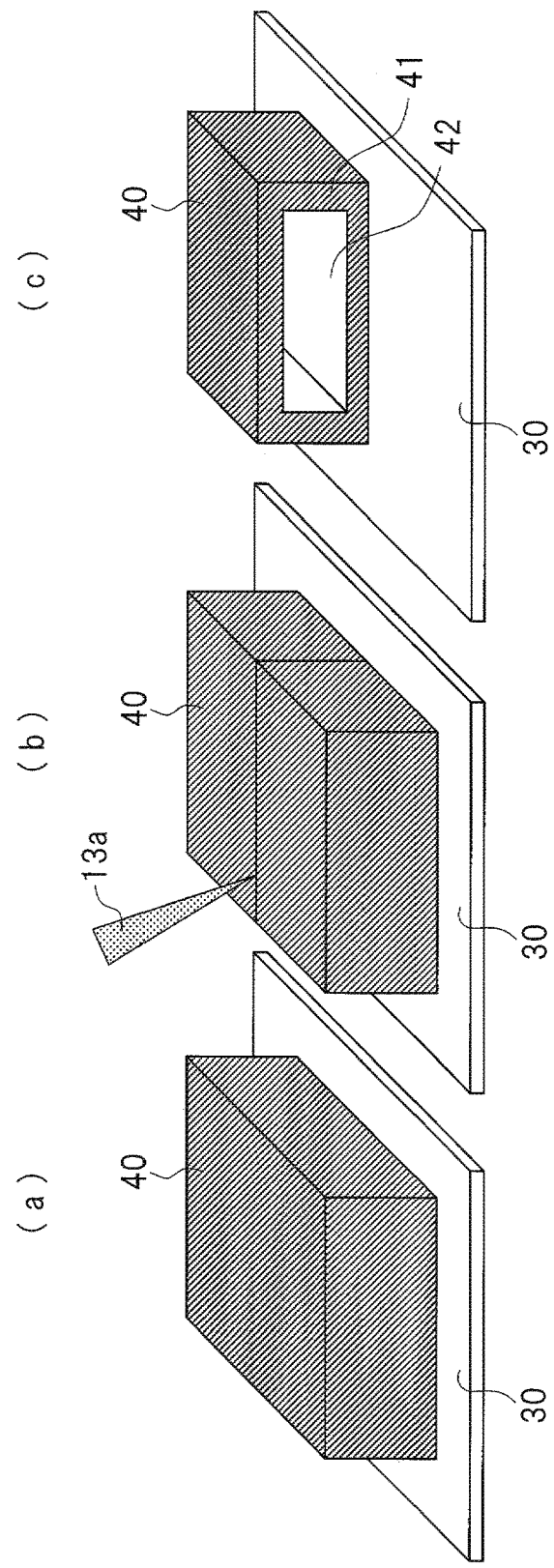

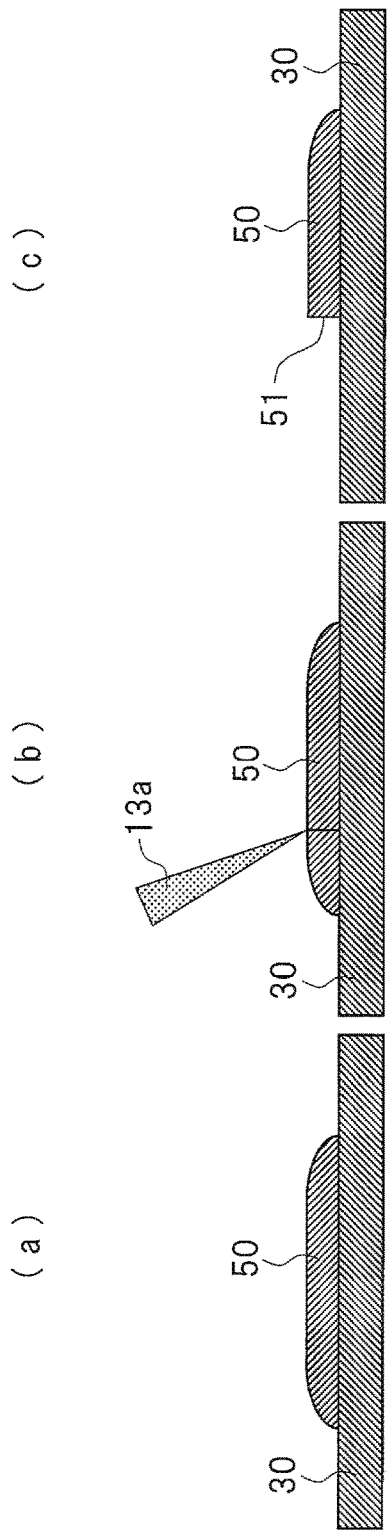

DEVICE PROCESSING METHOD AND DEVICE PROCESSING APPARATUS

TECHNICAL FIELD

The present invention relates to a device processing method and a device processing apparatus, and relates to, for example, a device processing method and a device processing apparatus for processing MEMS (Micro Electro Mechanical Systems).

BACKGROUND ART

JP-A-2004-209626 (PTL 1) discloses a technique for comparing a shape of a prototype structure fabricated by FIB (Focused Ion Beam) with a design shape and correcting film-formation conditions and (or) processing conditions so as to adjust differences therebetween, thereby fabricating a real structure.

CITATION LIST

Patent Literature

PTL 1: JP-A-2004-209626

SUMMARY OF INVENTION

Technical Problem

In the technique disclosed in PTL 1, since the fabrication of the prototype structure and the fabrication of the real structure are performed in series, a total value of the fabrication time of both the prototype structure and the real structure is required before the completion of the real structure. Further, when the desired structure is not completed in a second fabrication, a third structure is fabricated from the beginning again, and the fabrication time is also added in series. Accordingly, there was a problem that it took a long time from the start of fabrication of the prototype structure to the completion of fabrication of the real structure.

An object of the present invention is to provide a technique which can reduce the time from the start of fabrication of the prototype structure to the completion of fabrication of the real structure.

The above and other objects and novel characteristics of the present invention will be made apparent from the statement of the description and accompanying drawings.

Solution to Problem

The typical summary of the inventions disclosed in the present application will be briefly described as follows.

An exemplary embodiment provides a device processing method including steps of: fabricating a first structure using an ion beam under a first condition in a first region on a substrate; measuring a size of the first structure which is fabricated; comparing the measurement result with design data; determining a second condition from the comparison result; and fabricating a second structure using the ion beam under the second condition in a second region on the substrate.

An exemplary embodiment provides a device processing apparatus including: an FIB-SEM unit that is a combined unit of an FIB unit and an SEM unit; and a computer system that instructs the FIB-SEM unit to process and observe. According to the start instruction from the computer system, the FIB-SEM unit fabricates a first structure using an ion beam under a first condition in a first region on a substrate, measures a size of the first structure which is fabricated, compares the measurement result with design data, determines a second condition from the comparison result, and fabricates a second structure using the ion beam under the second condition in a second region on the substrate.

Advantageous Effects of Invention

The effects obtained by typical aspects of the present invention disclosed in the present application will be briefly described below.

According to one embodiment, it is possible to reduce the time from the start of fabrication of a prototype structure to the completion of fabrication of a real structure.

BRIEF DESCRIPTION OF DRAWINGS

FIG. 1 is a configuration diagram illustrating an example of an MEMS device processing apparatus of according to an embodiment.

FIG. 2 is a flowchart illustrating a first procedure example of an MEMS device processing method according to the embodiment.

FIG. 3 is a flowchart illustrating a second procedure example of the MEMS device processing method according to the embodiment.

FIG. 4 is an explanatory diagram illustrating an example of a structure according to the embodiment.

FIG. 5 is an explanatory diagram illustrating an example of design data according to the embodiment.

FIG. 6 is an explanatory diagram illustrating an example of measurement data according to the embodiment.

FIG. 7 is an explanatory diagram illustrating an example of differential data according to the embodiment.

FIG. 8 is a flowchart illustrating a procedure example of an MEMS device fabricating method according to the embodiment.

FIG. 9 is an explanatory diagram illustrating an example of a fabricating state in each step in FIG. 8.

FIG. 10 is an explanatory diagram illustrating an example of a fabricating state subsequent to FIG. 9 in each step.

FIG. 11 is an explanatory diagram illustrating an example of a fabricating state subsequent to FIG. 10 in each step.

FIG. 12 is an explanatory diagram illustrating an example of a fabricating state subsequent to FIG. 11 in each step.

FIG. 13 is an explanatory diagram illustrating an example of a fabricating state subsequent to FIG. 12 in each step.

FIG. 14 is an explanatory diagram illustrating an example of a fabricating state subsequent to FIG. 13 in each step.

FIG. 15 is an explanatory diagram illustrating an example of a case where a cavity is present inside a structure in a method of forming a cross section for observation to be used for size measurement in the embodiment.

FIG. 16 is an explanatory diagram illustrating an example of a case where a sagging film is formed at an end portion of a structure in the method of forming the cross section for observation to be used for size measurement in the embodiment.

DESCRIPTION OF EMBODIMENTS

In the following embodiment, the invention will be described in a plurality of sections or embodiments when required for convenience. However, these sections or embodiment are not irrelevant to each other unless otherwise stated, and the one relates to the entire or a part of the other as a modification example, details, or a supplementary explanation thereof.

In the embodiment described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiment described below, it goes without saying that the components (including element steps) are not always indispensable unless otherwise stated or except the case where the components are apparently indispensable in principle.

Similarly, in the embodiment described below, when referring to shapes, positional relationship or the like of the components, unless otherwise stated or except the case where the shape is apparently inapplicable in principle, substantially approximate or similar shapes are included. This applies to the values and range described above.

In all the drawings for describing the embodiments, members having the same functions are denoted by the same or related symbols and their repeated description is omitted. It should be noted that hatching may be used even in a plan view, and hatching may be omitted even in a cross-sectional view, so as to make the drawings easy to see.

The embodiment will be described in detail below with reference to the drawings. In order to make the features of the embodiment easier to understand, first of all, room for improvement existing in the related art will be described.

[Room for Improvement]

For example, the prototype of the MEMS device as an example of a device is often developed using a semiconductor fabricating technique. In such a method, prototype development often requires a long period of one year or more, and there are problems that the product can hardly be released in a short period of time and development costs increase. One of the reasons is that respective processes of film formation, photolithography, processing, and inspection are carried out by separate apparatuses.

On the other hand, a trial to apply a direct modeling technique using an FIB, a laser or the like is made to manufacture a minute three-dimensional structure. Above all, in the direct modeling using the FIB, processes such as film formation, processing, and inspection can be continuously performed in the same apparatus. In addition, since a photolithography process is not required, preparation of a photo mask is not necessary. It is considered that a prototype processing period of a MEMS device can be greatly shortened by utilizing these advantages. Accordingly, the inventors decide to utilize the direct modeling technique, which uses the FIB, for the prototype processing and processing of MEMS devices.

In general, when a device such as MEMS is fabricated, it is important to observe the size and shape of a structure, and to inspect the device to check whether the device is fabricated as designed in advance. This is because desired MEMS characteristics can hardly be obtained if a modeling shape differs from a designed structure. The same applies to the direct modeling that uses the FIB without exception. The above-described PTL 1 discloses the technique for comparing a shape of a prototype structure fabricated by FIB (Focused Ion Beam) with a design shape and correcting film-formation conditions and (or) processing conditions so as to adjust differences therebetween, thereby fabricating a real structure.

In the technique disclosed in PTL 1, since the fabrication of the prototype structure and the fabrication of the real structure are performed in series, a total value of the fabrication time of both the prototype structure and the real structure is required before the completion of the real structure. Further, when the desired structure is not completed in a second fabrication, a third structure is fabricated from the beginning again, and the fabrication time is also added in series. Accordingly, it takes a long time from the start of fabrication of the prototype structure to the completion of fabrication of the real structure. For this reason, the task is that the fabrication time of the prototype structure and the real structure are not added in series to shorten the time from the start of fabrication of the prototype structure to the completion of fabrication of the real structure.

In addition, PTL 1 does not disclose an algorithm that can automate comparison inspection and has a task to further shorten the time by automation.

In the technique disclosed in PTL 1, further, the shape of the prototype structure is observed only from the outside, and thus there is a task to grasp internal information.

Accordingly, in the embodiment, a contrivance is made for the room for improvement existing in the related art described above. A technical concept of the embodiment, in which the contrivance is made, will be described below with reference to the drawings. The technical concept in the embodiment is to provide a technique which enables to shorten the time from the start of fabrication of the prototype structure to the completion of fabrication of the real structure. Furthermore, the embodiment is to provide a technique for enabling measurement of the internal size of the prototype structure.

Embodiment

A device processing method and a device processing apparatus according to the embodiment will be described with reference to FIGS. 1 to 16. With respect to the device processing method and the device processing apparatus according to the embodiment, an MEMS device will be described as an example of the device, but other devices may be also applicable.

<Device Processing Apparatus>

The device processing apparatus according to the embodiment will be described with reference to FIG. 1. FIG. 1 is a configuration diagram illustrating an example of a configuration of an MEMS device processing apparatus according to the embodiment.

As illustrated in FIG. 1, the device processing apparatus according to the embodiment includes: an FIB-SEM unit 10 that is a combined unit of an FIB unit and an SEM (Scanning Electron Microscope) unit; and a computer system 20.

The FIB-SEM unit 10 includes, for example, a vacuum chamber 11, a stage 12, an ion gun 13, an electron gun 14, a gas gun 15, a charged particle detector 16, and a control unit 17. Each component of the FIB-SEM unit 10 is controlled by the control unit 17.

The vacuum chamber 11 is a chamber that is used to perform processing such as etching, film formation, and bonding for a device manufactured on a substrate 30, and that is used to observe the device after the processing. The stage 12 is disposed inside the vacuum chamber 11, and is a stage on which the substrate 30 is placed, the device being manufactured on the substrate 30.

The ion gun 13 is disposed inside the vacuum chamber 11, and is an ion gun used for etching, film formation, and bonding that use an ion beam 13a and used to obtain an SIM (Scanning Ion Microscope) image. The electron gun 14 is disposed inside the vacuum chamber 11, and is an electron gun used to obtain an SEM image by using an electron beam 14a. The gas gun 15 is disposed inside the vacuum chamber 11, and is a gas gun used for etching, film formation, and bonding that use a gas 15a.

The charged particle detector 16 is a detector used to obtain an SIM image or an SEM image. The control unit 17 is a unit that controls movement of the stage 12, irradiation of the ion beam 13a from the ion gun 13, irradiation of the electron beam 14a from the electron gun 14, and irradiation of the gas 15a from the gas gun 15.

The computer system 20 includes a calculation processing unit 21, a display and input unit 22, and an output unit 23, for example. The calculation processing unit 21 includes a storage 24 and the like. The computer system 20 is a system that instructs the FIB-SEM unit 10 to process and observe a device.

The computer system 20 performs size measurement using the SIM image or the SEM image in the observation, for example, and compares it with the design data with the calculation processing unit 21. The display and input unit 22 has a display function and an input function by a touch manner or the like. The display and input unit 22 includes a first region interface 22a, a second region interface 22b, a first condition interface 22c, a second condition interface 22d, an image interface 22e, and a start button 22f, for example.

The first region interface 22a is an interface displays a first region on a substrate 30 and allows an operator to input the first region. The second region interface 22b displays a second region on the substrate 30 and allows the operator to input the second region.

The first condition interface 22c is an interface that displays a first condition for fabricating a first structure using the ion beam 13a and allows the operator to input film-formation conditions and (or) processing conditions beginning with an ion beam dose amount. The second condition interface 22d is an interface that display a second condition for fabricating a second structure using the ion beam 13a and allows the operator to input film-formation conditions and (or) processing conditions beginning with an ion beam dose amount.

The image interface 22e is an interface that displays an SIM image by the charged particle detector 16 using the ion beam 13a or an SEM image by the charged particle detector 16 using the electron beam 14a and allows the operator to check or analyze the SIM image or the SEM image. The start button 22f is a button (object) which is operated by a start input (one click, one touch, or one tap) of the operator to instruct the start of processing after the operator inputs required information.

The output unit 23 outputs, for example, the results of processing and observation. The output unit 23 outputs the first region and the second region on the substrate 30, the first condition and the second condition using the ion beam 13a, and the SIM image or the SEM image.

The storage 24 is a storage (a memory unit) that stores, as electronic information, design data of a device manufactured on the substrate 30, and a fabrication recipe, processing data and the like that are used to perform processing based on the design data.

In the MEMS device processing apparatus according to the embodiment, after the operator inputs required information, when the operator one-clicks the start button 22f, the process from the start of fabrication of the prototype structure to the completion of fabrication of the real structure is automatically executed. For example, the device processing apparatus automatically performs a process of fabricating the first structure using the ion beam 13a under the first condition in the first region on the substrate 30, measuring the size of the first structure which is fabricated, comparing the measured result with design data, determining the second condition from the comparison result, and fabricating the second structure using the ion beam 13a under the second condition in the second region on the substrate 30.

<Device Processing Method>

The device processing method according to an embodiment will be described using FIGS. 2 to 7. FIG. 2 is a flowchart illustrating a first example of a procedure of a MEMS device processing method. FIG. 3 is a flowchart illustrating a second example of the procedure of the MEMS device processing method. FIG. 4 is an explanatory diagram illustrating an example of a structure. FIG. 5 is an explanatory diagram illustrating an example of design data. FIG. 6 is an explanatory diagram illustrating an example of measurement data. FIG. 7 is an explanatory diagram illustrating an example of differential data.

The MEMS device processing method according to the present embodiment is executed in the above-described device processing apparatus, and includes the first example as illustrated in FIG. 2 and the second example as illustrated in FIG. 3. The first example is an example in which the steps from a start of fabricating of a first structure to a completion of the fabricating of a second structure are automatically performed. The second example is an example in which the steps from the start of fabrication of the first structure to the completion of fabrication of the second structure are semi-automatically performed.

First Example

In the first example of the procedure of the MEMS device processing method according to the present embodiment, as illustrated in FIG. 2, first, the device processing apparatus fabricates the first structure in the first region on the substrate 30 using the ion beam 13a under a first condition (step S1). In step S1, in the FIB-SEM unit 10, the ion beam 13a is irradiated from the ion gun 13 to fabricate the first structure in the first region on the substrate 30. The first region on the substrate 30 is a region other than the region where the MEMS is manufactured. The first condition is a condition of an ion beam dose amount or the like. The first structure is a prototype structure and is a dummy structure for fabricating a real structure.

For example, the first structure is a structure as illustrated in FIG. 4. This structure is configured with a rectangular cylinder shape having a cavity and is manufactured on the substrate by vertically setting one pair of side surfaces of the rectangular cylinder shape. The one pair of the side surfaces of the rectangular cylinder shape has a size of a×c. The other pair of the side surfaces of the rectangular cylinder shape has a size of b×c. The cavity inside of the rectangular cylinder shape is opened with a size of d×e.

The fabrication of the first structure under the first condition of step S1 is preferably performed in a plurality of points other than the first region. The plurality of points other than the first region are also included in the region other than the region where the MEMS is manufactured.

Next, the device processing apparatus measures the sizes of the fabricated first structure (step S2). In the step S2, in the FIB-SEM unit 10, the ion beam 13a is irradiated from the ion gun 13 and the SIM image detected by the charged particle detector 16 is used or the electron beam 14a is irradiated and the SEM image detected by the charged particle detector 16 is used to measure the sizes of the first structure by a calculation process of the calculation processing unit 21 of the computer system 20. When measuring the sizes of the first structure, in a case where a cross section of the first structure is not exposed, the cross section of the first structure is exposed by etching using the ion beam 13a and the size measurement is performed using the cross section.

The device processing apparatus compares the measured result with the design data. In the comparison between the measured result and the design data, the difference between the size measurement result of the first structure and the design data is automatically calculated (step S3). It is automatically determined whether the difference is within an allowable range (step S4). Insteps S3 and S4, the calculation processing unit 21 of the computer system 20 compares the measurement result of the size of the first structure calculated using the SIM image or the SEM image detected by the charged particle detector 16 with the design data stored in the storage 24 to automatically calculate the difference and automatically determine whether the difference is within the allowable range.

The design data 150 corresponds to the structure illustrated in FIG. 4 and includes size data (μm) 151 of the structure and the allowable range (μm) 152, as illustrated in FIG. 5. In an example of FIG. 5, in the size data 151, a size a is "10.2", a size b is "5.1", and a size c is "2.2". In the allowable range 152, an allowable range ±Δa of the size a is "±0.4", an allowable range ±Δb of the size b is "±0.2", and an allowable range ±Δc of the size c is "±0.3".

As illustrated in FIG. 6, in measurement data 153, the size a is "9.9", the size b is "5.0", and the size c is "2.4". As illustrated in FIG. 7, in differential data 154 with respect to the design data 150 in the measurement data 153, the size a is "0.3", the size b is "0.1", and the size c is "0.2". In this example, the difference (the differential data 154) between the measurement data 153 of the measurement result and the design data 150 is within the allowable range 152.

As a result of the determination in step S4, in a case where the difference is not within the allowable range, the device processing apparatus decides a second condition (step S5). A method of determining the second condition includes a method of automatically calculating the ion beam dose amount from the film formation rate and (or) the processing rate. In this method, the calculation processing unit 21 of the computer system 20 automatically calculates the ion beam dose amount from the film formation rate and (or) the processing rate stored in the storage 24. The automatic calculation of the second condition includes the calculation of the film formation rate and (or) the processing rate that is (or are) a film formation amount and (or) a process amount with respect to the ion beam dose at the time of fabricating the first structure, and a calculation of the ion beam dose amount to be added to or subtracted from that of the first condition.

Another method of the method of determining the second condition includes a method of automatically selecting a condition from a database that is prepared in advance. In the other method, the calculation processing unit 21 of the computer system 20 automatically selects the condition from the database that is prepared in the storage 24 in advance.

On the other hand, as the result of the determination of step S4, in a case where the difference is within the allowable range, the device processing apparatus sets the first condition to the second condition (step S6).

The device processing apparatus fabricates the second structure in the second region on the substrate 30 using the ion beam 13a under the second condition (step S7). In step S7, in the FIB-SEM unit 10, the ion beam 13a is irradiated from the ion gun 13 to fabricate the second structure in the second region on the substrate 30. The second region on the substrate 30 is the region where the MEMS is manufactured. The second structure is the real structure and is a main structure configuring the MEMS. The second structure is fabricated on the MEMS during manufacturing in the second region.

Therefore, the MEMS device processing method in the first example is ended. In steps S1 to S7, the fabrication of the first structure in step S1, the size measurement of the first structure in step S2, and the fabrication of the second structure in step S7 are performed in an in-line manner in the same FIB-SEM unit 10 according to the present embodiment without destabilizing a vacuum condition.

Second Example

The above-described first example is the example in which the steps from the start of fabrication of the first structure to the completion of fabrication of the second structure are automatically performed. However, the second example is the example in which the steps from the start of fabrication of the first structure to the completion of fabrication of the second structure are semi-automatically performed. The semi-automatic means that a person such as a worker intervenes in some of steps from the start of fabrication of the first structure to the completion of fabrication of the second structure. In the second example, differences from the first example described above will mainly be described.

In the second example of the procedure of the MEMS device processing method according to the present embodiment, as illustrated in FIG. 3, first, similarly to the first example described above, the device processing apparatus fabricates the first structure in the first region on the substrate 30 using the ion beam 13a under the first condition (step S11). In step S11, in the FIB-SEM unit 10, the ion beam 13a is irradiated from the ion gun 13 to fabricate the first structure in the first region on the substrate 30.

The fabrication of the first structure under the first condition of step S11 is preferably performed in the first region and the plurality of points other than the first region. The plurality of points other than the first region are also included in the region other than the region where the MEMS is manufactured.

Next, the device processing apparatus measures the sizes of the fabricated first structure (step S12). In the step S12, in the FIB-SEM unit 10, the ion beam 13a is irradiated from the ion gun 13 and the SIM image detected by the charged particle detector 16 is used or the electron beam 14a is irradiated and the SEM image detected by the charged particle detector 16 is used to measure the sizes of the first structure by the calculation process of the calculation processing unit 21 of the computer system 20.

The device processing apparatus compares the measured result with the design data. In the comparison between the measured result and the design data, the difference between the size measurement result of the first structure and the design data is automatically calculated (step S13). It is automatically determined whether the difference is within the allowable range (step S14). In steps S13 and S14, the calculation processing unit 21 of the computer system 20 compares the measurement result of the sizes of the first structure calculated using the SIM image or the SEM image detected by the charged particle detector 16 with the design data stored in the storage 24 to automatically calculate the difference and automatically determine whether the difference is within the allowable range.

As a result of the determination of step S14, in a case where the difference is not within the allowable range, the device processing apparatus decides the second condition (step S15). The method of determining the second condition includes the method of automatically calculating the ion beam dose amount from the film formation rate and (or) the processing rate, similarly to the first example. In this method, the calculation processing unit 21 of the computer system 20 automatically calculates the ion beam dose amount from the film formation rate and (or) the processing rate stored in the storage 24. Another method of the method of determining the second condition includes the method of automatically selecting the condition from the database that is prepared in advance. In the other method, the calculation processing unit of the computer system 20 automatically selects the condition from the database that is prepared in the storage 24 in advance.

Besides, in the second example, the method of determining the second condition includes a method of inputting a condition considered by a person, or a method of selecting a condition from the database that is prepared in advance. In the method in which the person intervenes in some of steps, in the display and input unit 22 of the computer system 20, the person inputs the condition from the second condition interface 22d. Alternatively, the condition from the database that is prepared in the storage 24 in advance is displayed on the second condition interface 22d, and the person selects the displayed condition.

On the other hand, as the result of the determination of step S14, in a case where the difference is within the allowable range, the device processing apparatus sets the first condition to the second condition (step S16).

Next, the person determines whether to fabricate the second structure under the second condition (step S17). As a result of the determination in step S17, in a case where the second structure is fabricated under the second condition, the device processing apparatus fabricates the second structure using the ion beam 13a under the second condition in the second region on the substrate 30 (step S18). In step S18, in the FIB-SEM unit 10, the ion beam 13a is irradiated from the ion gun 13 and the second structure is fabricated in the second region on the substrate 30.

On the other hand, as a result of the determination of step S17, in a case where the second structure is not fabricated under the second condition, the device processing apparatus stops the fabrication of the second structure (step S19).

Therefore, the MEMS device processing method in the second example is ended. In steps S11 to S19, the fabrication of the first structure in step S11, the size measurement of the first structure in step S12, and the fabrication of the second structure in step S17 are performed in the in-line manner in the same FIB-SEM unit 10 according to the present embodiment without destabilizing the vacuum condition.

<Device Fabricating Method>

The device fabricating method in the embodiment will be described using FIGS. 8 to 14. FIG. 8 is a flowchart illustrating an example of a procedure of the MEMS device fabricating method. FIGS. 9 to 14 are explanatory diagrams illustrating an example of a fabricating state in each step in FIG. 8.

The MEMS device fabricating method in the present embodiment is executed in the above-described device processing apparatus, and first, the design data is received from an operator through the display and input unit 22 of the computer system 20 (step S21). The design data is stored in the storage 24.

The calculation processing unit 21 of the computer system 20 generates a fabrication recipe based on the design data (step S22).

Next, the FIB-SEM unit 10 starts the MEMS manufacturing (step S23). In a case where the MEMS manufacturing is started, the calculation processing unit 21 of the computer system 20 determines whether the step is a step required to be inspected. For example, the step required to be inspected includes a step having low stability in each step of MEMS manufacturing or an unknown step such as a step of preparing a new structure.

As a result of the determination of step S24, in a case of the step to be inspected, the device processing apparatus performs the above-described processes of the MEMS device processing method illustrated in FIG. 2 or FIG. 3 (step S25). On the other hand, as the result of the determination of step S24, in a case of the step that is not required to be inspected, the FIB-SEM unit 10 manufactures a portion of the structure of the MEMS using the ion beam 13a in the second region on the substrate 30 (step S26).

The calculation processing unit 21 of the computer system 20 determines whether all the MEMS manufacturing steps are ended (step S27). As a result of the determination of the step S27, in a case where all the MEMS manufacturing steps are not ended, the FIB-SEM unit 10 returns to step S24 and repeats the processes of steps S24 to S27. On the other hand, as the result of the determination of the step S27, in a case where all the MEMS manufacturing steps are ended, the MEMS manufacturing method is completed.

Next, the manufacturing state in each step in the procedure of the MEMS device fabricating method will be described with reference to FIGS. 9 to 14.

FIG. 9 illustrates a state in which a portion of a structure 31 of the MEMS during the manufacturing is fabricated on the substrate 30. In an example of FIG. 9, the structure 31 of the portion of the MEMS during the manufacturing is fabricated in a region of a central portion that is the second region on the substrate 30. For example, the structure 31 is fabricated by the ion beam 13a is irradiated from the ion gun 13 and forming the film in the FIB-SEM unit 10. The state illustrated in FIG. 9 is a state before performing steps S1 and S11 in the MEMS device processing method illustrated in FIGS. 2 and 3 described above.

FIG. 10 illustrates a state in which the device processing apparatus fabricates a first structure 32 that is the prototype structure in the first region on the substrate 30 using the ion beam 13a under the first condition with respect to the state illustrated in FIG. 9. In an example of FIG. 10, the first structure 32 is fabricated in a region of a peripheral portion that is the first region on the substrate 30. For example, in the FIB-SEM unit 10, the first structure 32 is fabricated by bonding the structure as illustrated in FIG. 4 by irradiating the ion beam 13a from the ion gun 13. The state illustrated in FIG. 10 is a state corresponding to steps S1 and S11 in the MEMS device processing method illustrated in FIGS. 2 and 3 described above.

FIG. 11 illustrates a state in which the device processing apparatus fabricates a second structure 33 that is the real structure in the second region on the substrate 30 using the ion beam 13a under the second condition on the structure 31 of the portion of the MEMS during the manufacturing with respect to the state illustrated in FIG. 10. In an example of FIG. 11, the second structure 33 is fabricated on the structure 31 of the portion of the MEMS during the manufacturing in the region of the central portion that is the second region on the substrate 30. For example, in the FIB-SEM unit 10, the second structure 33 is fabricated by bonding the structure as illustrated in FIG. 4 by irradiating the ion beam 13a from the ion gun 13. The state illustrated in FIG. 11 is a state corresponding to steps S7 and S18 in the MEMS device processing method illustrated in FIGS. 2 and 3 described above.

FIG. 12 illustrates a state in which the step illustrated in FIG. 11 is completed and the fabrication of the second structure 33 is completed on the structure 31 of the portion of the MEMS during the manufacturing.

FIGS. 13 and 14 illustrate a state in which the device processing apparatus fabricates further another structure similarly to FIGS. 10 and 11 described above with respect to the state illustrated in FIG. 12.

FIG. 13 illustrates a state in which the device processing apparatus fabricates a 1A structure 34 that is the prototype structure in a 1A region on the substrate 30 using the ion beam 13a under a 1A condition with respect to the state illustrated in FIG. 12. In this state, the 1A region on the substrate 30 is a region having the same definition as that of the first region and different from the first region. The 1A condition is a condition having the same definition as that of the first condition and different from the first condition. The 1A structure 34 is a structure having the same definition as that of the first structure 32 and is a structure different from the first structure. For example, in the FIB-SEM unit 10, the 1A structure 34 is fabricated by the irradiating the ion beam 13a from the ion gun 13 and forming the film.

FIG. 14 illustrates a state in which the device processing apparatus fabricates a 2A structure 35 that is the real structure in a 2A region on the substrate 30 using the ion beam 13a under a 2A condition on the 2A structure 33 with respect to the state illustrated in FIG. 13. In this state, the 2A region on the substrate 30 is a region on the second structure 33 in a region having the same definition as that of the second region. The 2A condition is a condition having the same definition as that of the second condition and different from the second condition. The 2A structure 35 is a structure having the same definition as that of the second structure 33 and is a structure different from the second structure. For example, in the FIB-SEM unit 10, the 2A structure 35 is fabricated by the irradiating the ion beam 13a from the ion gun 13 and forming the film.

As described above, the structure 31 of the portion of the MEMS during the manufacturing is fabricated on the substrate 30, the second structure 33 is fabricated on the structure 31, the 2A structure 35 is fabricated on the second structure 33, and thus the MEMS device fabricating method is completed.

For example, the MEMS device is a device structure of an acceleration sensor in which the structure 31 of the portion of the MEMS during the manufacturing is a lower electrode, the second structure 33 on the structure 31 is a structure such as a spring, and the 2A structure 35 on the second structure 33 is an upper electrode.

<Method of Forming Observation Cross Section Used for Size Measurement>

The method of forming the observation cross section used for the size measurement in the embodiment will be described using FIGS. 15 and 16. FIG. 15 is an explanatory diagram illustrating an example of a case where a cavity is present inside the structure in the method of forming the observation cross section used for the size measurement. FIG. 16 is an explanatory diagram illustrating an example of a case where a sagging film is formed at the end portion of the structure in the method of forming the observation cross section used for the size measurement.

In FIG. 15, (a) illustrates a bird's eye view of a state in which a structure 40 having a cavity 42 therein on the substrate 30 is fabricated, (b) illustrates a bird's eye view of a state of exposing a cross section 41 of the structure 40, and (c) illustrates a bird's eye view of a state in which the cross section 41 of the structure 40 is exposed.

As illustrated in FIG. 15, in a case where the cavity is present inside the structure 40 fabricated on the substrate 30, when measuring the size of the structure 40, the device processing apparatus exposes the cross section 41 of the structure 40 by etching using the ion beam 13a and implements the size measurement of the structure 40 using the cross section 41. For example, in the example of the structure as illustrated in FIG. 4 described above, it is also possible to measure the size d×e of the cavity by exposing the cross section 41 of the structure 40.

In FIG. 16, (a) illustrates a cross-sectional view of a state in which a structure 50 of a sagging film formed at the end of the structure 50 on the substrate 30 is fabricated, (b) illustrates a cross-sectional view of a state of exposing a cross section 51 of the structure 50, and (c) illustrates a cross-sectional view of a state in which the cross section 51 of the structure 50 is exposed.

As illustrated in FIG. 16, in a case where a sagging film is formed at the end of the structure 50 fabricated on the substrate 30, when measuring the size of the structure 50, the device processing apparatus exposes the cross section 51 of the structure 50 by etching using the ion beam 13a and implements the size measurement of the structure 50 using the cross section 41.

<Effect>

According to the present embodiment described above, it is possible to shorten the time from the start of fabrication of the prototype structure to the completion of fabrication of the real structure. More specifically, the device processing apparatus fabricates the prototype structure that is the first structure under the first condition in the first region on the substrate 30 and fabricates the real structure that is the real structure in the second region on the substrate under the second condition decided from the comparison result between the size measurement result of the prototype structure and the design data. Therefore, it is possible to prevent adding the fabricating time of the prototype structure and the fabricating time of the real structure in series. As a result, it is possible to shorten the time from the start of fabrication of the prototype structure to the completion of fabrication of the real structure.

In addition, the device processing apparatus measures the size of the prototype structure, compares the measurement result with the design data, and automates the step of determining the second condition from the comparison result. Therefore, it is possible to further shorten the time from the start of fabrication of the prototype structure to the completion of fabrication of the real structure.

In a case where the cavity 42 is present inside the structure 40 that is the prototype structure, the device processing apparatus exposes the cross section 41 of the structure by etching using the ion beam 13a and implements the size measurement of the structure using the cross section 41. Therefore, it is possible to measure the size the inside of the structure 40.

In addition, it is possible to perform the fabrication of the prototype structure, the size measurement of the prototype structure, and the fabrication of the real structure in the in-line manner in the same FIB-SEM unit 10 without destabilizing the vacuum condition.

As described above, the invention made by the present inventor has been concretely described based on the embodiment, but it is needless to say that the present invention is not limited to the foregoing embodiment and various modifications can be made within the scope of the present invention. For example, the MEMS device is described as an example of the device in the embodiment, but the present invention may be applicable to other devices and the like. In addition, the acceleration sensor is described as an example of the MEMS device, but the present invention may be applicable to other sensors and the like.

It should be noted that the present invention is not limited to the above-described embodiment, but includes various modified examples. For example, the embodiment is described in detail in order to understandably describe the present invention, and is not necessarily limited to those including all the described configurations.

Further, other configuration can be added, eliminated, and replaced with respect to a part of the configuration of the embodiment.

REFERENCE SIGNS LIST

10: FIB-SEM unit
11: vacuum chamber
12: stage
13: ion gun
13a: ion beam
14: electron gun
14a: electron beam
15: gas gun
15a: gas
16: charged particle detector
17: control unit
20: computer system
21: calculation processing unit
22: display and input unit
30: substrate
31: structure of part of MEMS during manufacturing
32: first structure
33: second structure
34: 1A structure
35: 2A structure
40: structure
41: cross section
42: cavity
50: structure
51: cross section

The invention claimed is:

1. A device processing method comprising steps of:
fabricating a first structure using an ion beam under a first condition in a first region on a substrate;
measuring a size of the first structure which is fabricated;
comparing the measurement result with design data;
determining a second condition from the comparison result, said determining including:
calculating at least one of a film formation rate which is a film formation amount and a processing rate which is a processing amount, with respect to an FIB dose amount at the time of fabricating the first structure, and
calculating an FIB dose amount to be added to or subtracted from the first condition; and
fabricating a second structure using the ion beam under the second condition in a second region on the substrate.

2. The device processing method according to claim 1, wherein
the second structure is a structure constituting an MEMS, and is fabricated on the MEMS in the middle of manufacturing in the second region.

3. The device processing method according to claim 1, wherein
the step of measuring the size of the first structure includes exposing a cross section of the first structure by etching using the ion beam and performing size measurement of the first structure using the cross section.

4. The device processing method according to claim 1, wherein
the step of measuring the size of the first structure includes performing the size measurement of the first structure using an SEM or an SIM.

5. The device processing method according to claim 1, wherein
the design data includes size data of an MEMS structure and an allowable range of the size data, and
the step of comparing the measurement result with the design data includes automatically calculating a difference between the size measurement result of the first structure and the design data, automatically determining whether the difference is included in the allowable range, and determining the second condition only when the difference is not included in the allowable range.

6. The device processing method according to claim 1, wherein
the step of fabricating the first structure, the step of measuring the size of the first structure, and the step of fabricating the second structure are performed in an in-line manner in the same apparatus without destabilizing a vacuum condition.

7. The device processing method according to claim 1, wherein
the step of fabricating the first structure includes fabricating the first structure under the first condition at a plurality of points other than the first region.

8. A device processing method comprising steps of:
fabricating a first structure using an ion beam under a first condition in a first region on a substrate;
measuring a size of the first structure which is fabricated;
comparing the measurement result with design data;
determining a second condition from the comparison result; and
fabricating a second structure using the ion beam under the second condition in a second region on the substrate, said fabricating including fabricating the first structure under the first condition at a plurality of points other than the first region.

9. The device processing method according to claim 8, wherein
the second structure is a structure constituting an MEMS, and is fabricated on the MEMS in the middle of manufacturing in the second region.

10. The device processing method according to claim 8, wherein
the step of measuring the size of the first structure includes exposing a cross section of the first structure by etching using the ion beam and performing size measurement of the first structure using the cross section.

11. The device processing method according to claim 8, wherein
   the step of measuring the size of the first structure includes performing the size measurement of the first structure using an SEM or an SIM.

12. The device processing method according to claim 8, wherein
   the design data includes size data of an MEMS structure and an allowable range of the size data, and
   the step of comparing the measurement result with the design data includes automatically calculating a difference between the size measurement result of the first structure and the design data, automatically determining whether the difference is included in the allowable range, and determining the second condition only when the difference is not included in the allowable range.

13. The device processing method according to claim 8, wherein
   the step of fabricating the first structure, the step of measuring the size of the first structure, and the step of fabricating the second structure are performed in an in-line manner in the same apparatus without destabilizing a vacuum condition.

14. The device processing method according to claim 8, wherein
   the step of determining the second condition includes a step of calculating at least one of a film formation rate which is a film formation amount and a processing rate which is a processing amount, with respect to an FIB dose amount at the time of fabricating the first structure, and a step of calculating an FIB dose amount to be added to or subtracted from the first condition.

\* \* \* \* \*